(12) United States Patent
Nagase et al.

(10) Patent No.: US 6,302,600 B1
(45) Date of Patent: Oct. 16, 2001

(54) APPARATUS FOR TREATING SURFACE OF BOARDS

(75) Inventors: Hideo Nagase, Tokyo; Shu Ogawa, Nagareyama; Kiyoshi Kamibayashi, Matsudo; Makoto Kikukawa, Fujinomiya; Takahiro Houzan, Himeji; Toshimoto Nakagawa; Mitsumoto Nakagawa, both of Kawasaki, all of (JP)

(73) Assignees: Nagase & Co., Ltd., Osaka; Hirama Rika Kenkyujo Ltd., Kanagawa, both of (JP)

(*) Notice: Subject to any disclaimer, the term of this patent is extended or adjusted under 35 U.S.C. 154(b) by 0 days.

(21) Appl. No.: 09/577,045

(22) Filed: May 24, 2000

(51) Int. Cl.$^7$ ..................................................... G03D 5/00
(52) U.S. Cl. ........................ 396/611; 396/578; 396/626; 118/52; 134/56 R
(58) Field of Search ..................................... 396/604, 611, 396/626, 578; 118/52, 54, 316, 319, 500, 716, 726; 427/240; 134/2, 3, 4, 157, 148, 902, 56 R; 210/639

(56) References Cited

U.S. PATENT DOCUMENTS 4,786,417 * 11/1988 Miki et al. ........................... 210/639
5,896,874 * 4/1999 Nakagawa et al. ................ 134/56 R

* cited by examiner

Primary Examiner—D Rutledge
(74) Attorney, Agent, or Firm—Jones, Tullar & Cooper, P.C.

(57) ABSTRACT

The apparatus for treating surface of boards includes treating means for treating surface of boards by supplying sequentially a treating solution and a rinse liquid on boards placed on a treating table; solution collecting means for collecting waste treating solution separately from waste rinse liquid; waste solution storing, concentrating detecting and solution supplementing means for storing the waste treating solution, detecting the concentration of at least one ingredient in the waste treating solution by an electric conductivity meter and/or an absorption photometer, supplementing treating solution for adjusting containing necessary ingredients depending on the detected value, and adjusting the treating solution; and treating solution feed means for feeding the adjusted treating solution into the treating means. By thus constructing, the treating solution can be recycled, and if recycling is repeated, the performance of the treating solution itself can be maintained.

24 Claims, 5 Drawing Sheets

APPARATUS FOR TREATING SURFACE OF BOARDS

BACKGROUND OF THE INVENTION

The present invention relates to an apparatus for treating the surface of boards, and more particularly to an apparatus for treating the surface of boards capable of separating completely a waste treating solution and a waste rinse liquid after treating the surface of boards, and regenerating (repreparing) the collected waste treating solution to a treating solution for recycling the treating solution.

In the manufacture of various electronic devices (elements) such as semiconductor devices and liquid crystal display devices, in the first place, a thin film of insulator layer, semiconductor layer and a conductor layer are formed on the surface of the substrate. Next, after applying a resist layer on formed thin film, the layer is exposed by a photo mask, and patterned by a developing solution and an etching solution. Then, by applying a resist stripping solution, the resist left over on the board surface is removed. Further, on the board surface, a rinse liquid (such as isopropyl alcohol, other alcohol, pure water, or the like) is applied, and fine resist particles and treating solution still remaining on the surface are removed. Thus, in manufacture of electronic devices (elements), the operation is conducted in a wet process using a plurality of treating solutions and a rinse liquid.

In this wet process, boards such as wafers are treated by (1) a method of immersing directly in a treating bath containing a treating solution and a rinsing bath containing a rinse liquid, (2) a method of using a spinner fixed on a rotatable wafer chuck for treating the entire board by applying the treating solution and rinse liquid on the board surface sequentially by spray nozzles or straight nozzles, and making use of the rotation of a wafer chuck, (3) a method of disposing boards on the roller conveyor, and applying the treating solution and rinse liquid sequentially in the treating direction of the boards, or (4) a method of disposing multiple boards on a cassette, and applying the treating solution and rinse liquid sequentially on the boards surface by spray nozzles.

In this technique of immersion, however, there was a problem of change of concentration of ingredients in the treating solution in the course of treating multiple wafers, and stable surface treatment was impossible. In the case of using a spinner or a roller conveyor, on the other hand, it produces a tremendous volume of waste liquid mixing waste liquid of treating solution (waste treating solution) and waste liquid of rinse liquid (waste rinse liquid).

Various spinners have been proposed for separating the mixed liquid of treated boards into a waste treating solution and a waste rinse liquid.

For example, the official gazette of Provisional Publication No. 190442/93 discloses a spinner having double cups including an outside cup and an inside cup disposed on the circumference of the wafer chuck. In this spinner, the inside cup is free to move up and down, and a plurality of treating solutions can be separated and collected by the vertical movement of the inside cup. The separated and collected waste treating solutions can be easily discarded or recycled.

The official gazette of Provisional Publication No. 88168/96 discloses a spinner in which an elevatable inner ring is provided on the circumference of the wafer chuck, when the inner ring is positioned in the upper part, its lower end is inside of the partition wall, and when the inner ring is positioned in the lower part, its lower end is outside of the partition wall.

On the other hand, the official gazette of Provisional Publication No. 283395/93 discloses a purifying apparatus of thin materials for applying a treating solution to the boards fixed on a rotatable supporter through a stock container, and collecting the waste treating solution and sending back to the stock container. This purifying apparatus can recycle the treating solution.

The official gazette of Japanese Patent No. 2602179 discloses a resist stripping solution control apparatus, using alkanolamine and organic solvent as the treating solution, for detecting the alkanolamine concentration in a waste treating solution (waste resist stripping solution) by an absorption photometer, and regenerating the treating solution by supplementing (replenishing) insufficient ingredients. Further, the official gazette of Provisional Publication No. 22261/98 discloses a resist stripping solution control apparatus, using alkanolamine, organic solvent and pure water as the treating solution, for detecting the pure water concentration in a waste treating solution (waste resist stripping solution) by an absorption photometer, and regenerating the treating solution by supplementing insufficient ingredients. These control apparatuses can detect and supplements specific ingredients in the treating solution, so that the treating solution always having a specific treating performance can be prepared without deteriorating the treating solution.

However, the spinner disclosed in the official gazette of Provisional Publication No. 190442/93 only separates and collects the waste treating solution, and the ingredients concentration in the treating solution may be changed while repeating circulation of treating solution or waste treating solution, and thereby the treating capacity of boards may be lowered.

The apparatus disclosed in the official gazette of Provisional Publication No. 283395/93 merely sends back the waste treating solution to the stock container, and the ingredients concentration in the treating solution may be changed while repeating circulation of treating solution or waste treating solution, and thereby the treating capacity of boards may be lowered.

Similarly, the spinner disclosed in the official gazette of Provisional Publication No. 88168/96 only separates and collects the waste treating solution, and the ingredients concentration in the treating solution may be changed while repeating circulation of treating solution or waste treating solution, and thereby the treating capacity of boards may be lowered.

In the control apparatuses in the official gazette of Japanese Patent No. 2602179 and the official gazette of Provisional Publication No. 22261/98, when applied in the apparatus for treating surface of boards using the spinner, the rinse liquid is mostly used in the quantity same as or more than the treating solution, and the waste treating solution cannot be separated and collected, and the concentration of the effective ingredients is substantially lowered by dilution, and it produces too much waste from the viewpoint of efficiency of regeneration.

In the resist stripping process of semiconductor boards and liquid crystal boards, a dry ashing process by oxygen plasma and a wet stripping process by resist stripping solution are combined. In the boards after the dry ashing process by oxygen plasma, metal oxides such as obstinate resist degenerated matter and silicon oxide are left over, and it is hard to remove all of them completely in the subsequent wet rest stripping process. It is attempted to raise the temperature of treating solution or extend the treating time, but it brings about a safety problem, and there is other problem from the viewpoint of production efficiency. To raise the physical treating capacity, it is proposed to use a spinner and apply the treating solution at a pressure of about 0.5 to 5 kg/cm$^2$G on the surface, and it is expected to enhance the treating capacity by the synergetic effects of rotatable spinner and pressure spraying.

Further, by using a plurality of spinners, it is also proposed to treat with the treating solution and rinse liquid separately by individual spinners, but the size of the apparatus for treating surface of boards is increased, and it is not realistic.

On the other hand, when the treating solution and rinse liquid are treated by a same spinner, the control apparatus may not be used as mentioned, and actually products may not be produced.

In this background there is an increasing demand for reducing the size of the apparatus for treating surface of boards and the control apparatus, using the treating solution sufficiently, recycling the treating solution effectively, applying the rinse liquid immediately after treatment with the treating solution, and decreasing the amount of waste treating solution.

OBJECT AND SUMMARY OF THE INVENTION

It is hence an object of the invention to present an apparatus for treating surface of boards capable of recycling the treating solution and maintaining the performance of the treating solution itself by recycled repeatedly, by collecting the waste treating solution after treating the surface of boards by completely separating from the waste rinse liquid, and regenerating the treating solution by supplementing necessary ingredients depending on the concentration changes of the ingredients of the solution into the collected waste treating solution.

To achieve the object, the apparatus for treating surface of boards of the invention comprises treating means for treating surface of boards by supplying sequentially a treating solution and a rinse liquid on boards placed on a treating table; solution collecting means for collecting waste treating solution separately from waste rinse liquid; waste solution storing means for storing the waste treating solution; concentrating detecting and solution supplementing means for detecting the concentration of at least one ingredient in the waste treating solution by an electric conductivity meter and/or an absorption photometer, supplementing treating solution for adjusting containing necessary ingredients depending on the detected value, and adjusting the treating solution; and treating solution feed means for feeding the adjusted treating solution into the treating means.

The apparatus for treating surface of boards of the invention also comprises treating means for treating surface of boards by supplying sequentially a treating solution and a rinse liquid on boards placed on a treating table; solution collecting means for collecting waste treating solution separately from waste rinse liquid; waste solution storing, concentrating detecting and solution supplementing means for storing the waste treating solution, detecting the concentration of at least one ingredient in the waste treating solution by an electric conductivity meter and/or an absorption photometer, supplementing treating solution for adjusting containing necessary ingredients depending on the detected value, and adjusting the treating solution; and treating solution feed means for feeding the adjusted treating solution into the treating means (see FIG. 1 to FIG. 5).

In an embodiment of the apparatus of the invention, the waste treating solution storing means has a stirring and filtering unit for stirring and filtering the waste treating solution.

In other embodiment of the apparatus of the invention, the waste solution storing, concentrating detecting and solution supplementing means has a stirring and filtering unit for stirring and filtering the adjusted treating solution.

In a different embodiment of the apparatus of the invention, waste rinse liquid separating means for collecting the waste rinse liquid, and separating into waste rinse liquid containing foreign matter right after starting collection and second waste rinse liquid (not containing foreign mater) in a specific time after start of collection, depending on the time lapse after start of collection of waste rinse liquid is connected to the solution collecting means (see FIG. 3, FIG. 4, and FIG. 5).

In a further different embodiment of the apparatus of the invention, the boards are printed circuit boards, liquid crystal boards, semiconductor boards, or plasma display boards.

In a further different embodiment of the apparatus of the invention, the treating table is any one of a rotatable wafer chuck (see FIG. 3 and FIG. 4), a roller conveyor (see FIG. 1 and FIG. 2), and a cassette (see FIG. 5).

In a further different embodiment of the apparatus of the invention, the treating table is the wafer chuck, and the solution storing means has an elevatable cup having an outer wall and an inner wall, and a housing for enclosing the cup. That is, in the apparatus of the invention, the treating table is the rotatable wafer chuck on which the boards are mounted, and the solution collecting means includes an inner wall elevatable between the position for closing the circumference of boards and the position for exposing the circumference of boards, an outer wall for forming an elevatable cup by integrally connecting to the outer circumference of the inner wall, and a housing for enclosing the elevatable cup formed by the inner wall and outer wall (see FIG. 3).

In a further different embodiment of the apparatus of the invention, the treating table is a wafer chuck, and the solution collecting means includes a partition wall fixed on the circumference of the wafer chuck, an inner cup having an inner skirt and an outer skirt, and a housing for enclosing the partition wall and the inner cup, in which the inner skirt is disposed inside of the partition wall when the inner cup is position at the upper side of the wafer chuck, and the outer skirt is disposed outside of the partition wall when positioned at the lower side of the wafer chuck. That is, in these apparatuses of the invention, the treating table is the rotatable wafer chuck on which the boards are mounted, and the solution collecting means includes an elevatable inner cup having an inner skirt and an outer skirt disposed to enclose around the boards, a housing for enclosing the inner cup, and a partition wall fixed on the bottom of the housing at a position between beneath the inner skirt and beneath the outer skirt, in which the waste solution from the boards is guided into the inner side of the partition wall from the inner skirt when the inner cup is positioned at the upper side of the boards, and the waste solution from the boards is guided into the outer side of the partition wall when the inner cup is positioned at the lower side of the boards (see FIG. 4).

In a further different embodiment of the apparatus of the invention, the treating solution supplied by the treating means is a developing solution.

In a further different embodiment of the apparatus of the invention, the developing solution is a solution containing an alkaline matter and 0.04 part by weight to 25 parts by weight of pure water in 100 parts by weight of the alkaline matter.

In this case, the ingredient detected by the electric conductivity meter and/or the absorption photometer is at least one of alkaline substance and dissolved resist in the developing solution.

The alkaline substance contained in the developing solution is at least one selected from the group consisting of potassium hydroxide, sodium hydroxide, sodium carbonate, sodium hydrogencarbonate, sodium phosphate, sodium silicate, tetramethyl ammonium hydroxide, and trimethyl monoethanol ammonium hydroxide.

In a further different embodiment of the apparatus of the invention, the treating solution supplied by the treating means is an etching solution for transparent conductive film.

In a further different embodiment of the apparatus of the invention, the etching solution for transparent conductive film is at least one of a mixed aqueous solution of hydrochloric acid and nitric acid, a mixed aqueous solution of hydrochloric acid and ferric chloride, an aqueous solution of hydrobromic acid, a mixed aqueous solution of hydrobromic acid and ferric chloride, a mixed aqueous solution of hydroiodic acid and ferric chloride, and an aqueous solution of oxalic acid.

In this case, the ingredient detected by the electric conductivity meter and/or the absorption photometer is at least one of acid and dissolved indium in the etching solution for transparent conductive film.

In a further different embodiment of the apparatus of the invention, the treating solution supplied by the treating means is a resist stripping solution.

In a further different embodiment of the apparatus of the invention, the resist stripping solution contains alkanolamine and 20 parts by weight to 800 parts by weight of organic solvent in 100 parts by weight of alkanolamine.

In this case, the ingredient detected by the electric conductivity meter and/or the absorption photometer is at least one of dissolved resist and alkanolamine in the resist stripping solution.

In a further different embodiment of the apparatus of the invention, the resist stripping solution contains alkanolamine, 20 parts by weight to 800 parts by weight of organic solvent, and 5 parts by weight to 900 parts by weight of pure water in 100 parts by weight of alkanolamine.

In a further different embodiment of the apparatus of the invention, the ingredient detected by the electric conductivity meter and/or the absorption photometer is at least one of dissolved resist, alkanolamine, and pure water in the resist stripping solution.

In a further different embodiment of the apparatus of the invention, the resist stripping solution contains alkanolamine, 20 parts by weight to 800 parts by weight of organic solvent, 5 parts by weight to 900 parts by weight of pure water, and 1 parts by weight to 300 parts by weight of hydroxylamine in 100 parts by weight of alkanolamine.

In this case, the ingredient detected by the conductivity meter and/or the absorption photometer is at least one of dissolved resist, alkanolamine, pure water, and hydroxylamine in the resist stripping solution.

The alkanolamine contained in the resist stripping solution is at least one amine selected from the group consisting of monoethanolamine, diethanolamine, triethanolamine, N,N-dimethyl ethanolamine, N,N-diethyl ethanolamine, aminoethyl ethanolamine, N-methyl-N,N-diethanolamine, N,N-dibutyl ethanolamine, N-methyl ethanolamine, and 3-amino-1-propanol.

DETAILED DESCRIPTION OF PREFERRED EMBODIMENTS

Figure 1:
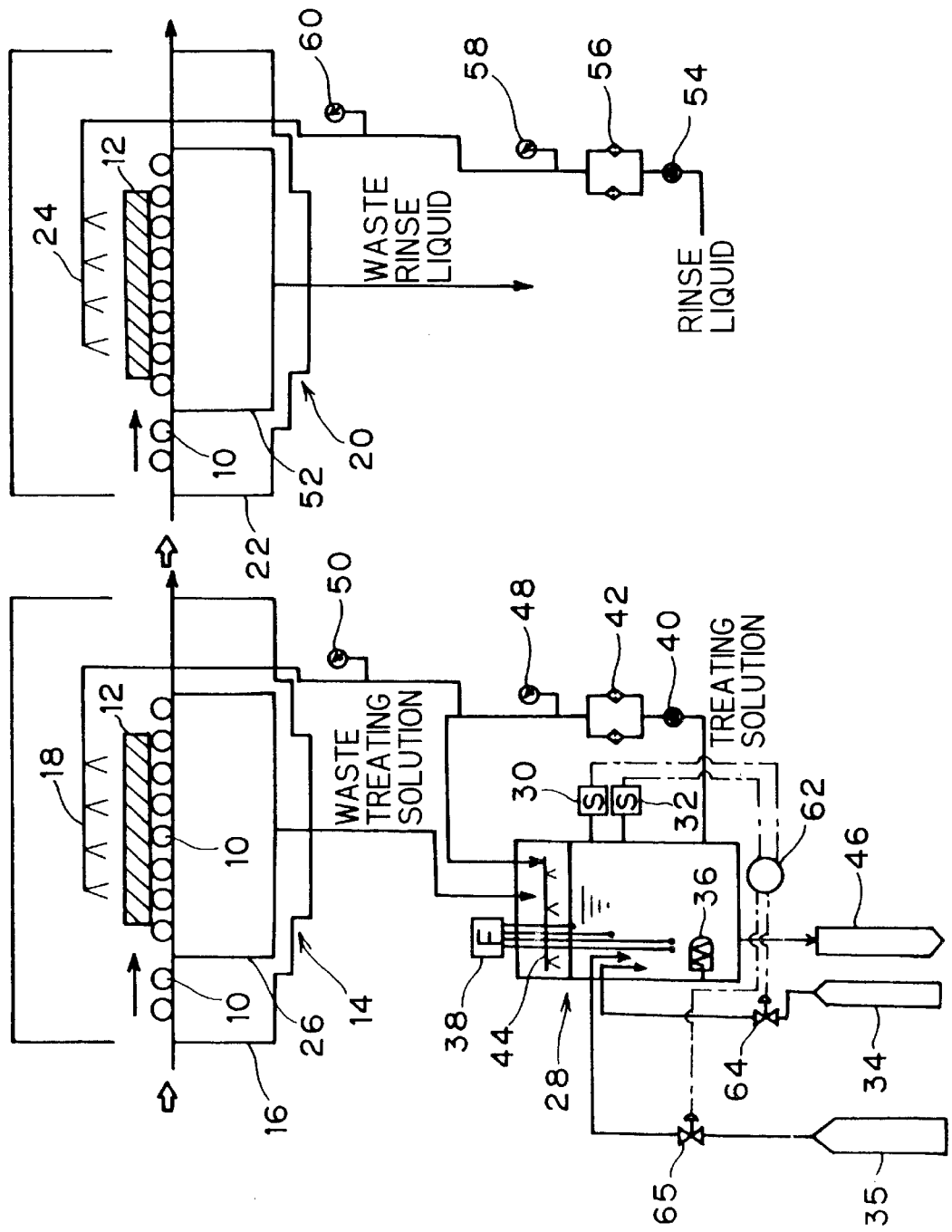
FIG. 1 is a systematic schematic structural diagram showing an apparatus for treating surface of boards in a first embodiment of the invention.

Referring now to the drawings, some of the preferred embodiments of the invention are described in detail below. It must be noted, however, that the invention is not limited to the following embodiments alone, but may be properly changed or modified.

FIG. 1 shows an apparatus for treating surface of boards according to a first embodiment of the invention. In this embodiment, boards are placed on a roller conveyor, and the treating solution and rinse liquid are sequentially supplied in the treating direction of the boards.

As shown in FIG. 1, a board 12 placed on a roller conveyor 10 moves in the direction of arrow in the diagram, and is led into a treating solution feed device 14. On the board 12 guided into a housing 16 in the treating solution feed device 14, a treating solution is supplied from a spray nozzle 18.

The board 12 of which surface is treated by the treating solution is put successively into a rinse liquid feed device 20. On the board 12 guided into a housing 22 in the rinse liquid feed device 20, a rinse liquid is supplied from a spray nozzle 24. As the rinse liquid, alcohol (for example, isopropyl alcohol) or pure water is used.

Instead of the spray nozzles 18, 24, straight nozzle or other nozzle may be used. Before the board 12 is led into the rinse liquid feed device 20 from the treating solution feed device 14, preferably, air or nitrogen gas is blown to the face and back side of the board 12 from a air knife or nitrogen knife by means of a blower (not shown) or the like, so that the treating solution adhered to the board is removed. As a result, the treating solution brought out by the board and the mist of the treating solution produced from the treating solution feed device 14 are prevented from getting into the rinse liquid feed device 20. In this embodiment, the treating solution feed device 14 and the rinse liquid feed device 20 are the treating means.

In the treating solution feed device 14, the treating solution after supplied to the board surface (waste treating solution) is discharged from the bottom of a waste solution sump 26, and sent into a waste solution collecting and supplementing device 28. The electric conductivity and/or absorbance of the waste treating solution stored in the waste solution collecting and supplementing device 28 is measured by an electric conductivity meter 30 and/or an absorption photometer 32, and the measured value is put into a controller 62, and the concentration of one or more ingredients in the waste treating solution is detected. Depending on the detected concentration, a control valve 64 and/or a control valve 65 is adjusted of the opening degree by a signal from the controller 62, treating solution for adjusting containing necessary ingredient to cover up to the loss is supplemented into the waste treating solution from a treating solution adjusting tank 34 and/or a treating solution adjusting tank 35, and the treating solution is adjusted. Reference numeral 36 is a heater for adjusting the temperature, and is provided to keep constant the temperature of the treating solution. Reference numeral 38 is a liquid level sensor, and is provided to control the liquid level of the treating solution.

The adjusting treating solution is sent into a filter 42 by a pump 40, and is filtered by the filter 42, and is supplied into the spray nozzle 18, and is recycled in the treating solution feed device 14 to be supplied to the board surface. In this case, as shown in FIG. 1, preferably, part of the treating solution filtered by the filter 42 is put back into the waste solution collecting and supplementing device 28, and to enhance the stirring effect when adjusting the treating solution, for example, it may be put back to the waste solution collecting and supplementing device 28 by using a spray nozzle 44. Depending on the supplemented amount of treating solution adjusting ingredient, or by overflow, part of the waste treating solution is discharged into a waste treating solution tank 46. Reference numerals 48 and 50 are pressure gauges.

In the embodiment, a waste solution storing tank for storing the waste treating solution may be disposed between the waste solution sump 26 and the waste solution collecting and supplementing device 28.

On the other hand, in the rinse liquid feed device 20, the waste liquid of rinse liquid (waste rinse liquid) is discharged from the bottom of a waste liquid sump 52, and is collected separately from the waste treating solution, or discarded (not shown). Reference numeral 54 is a pump, 56 is a filter for filtering the waste rinse liquid, and 58 and 60 are pressure gauges.

Figure 2:
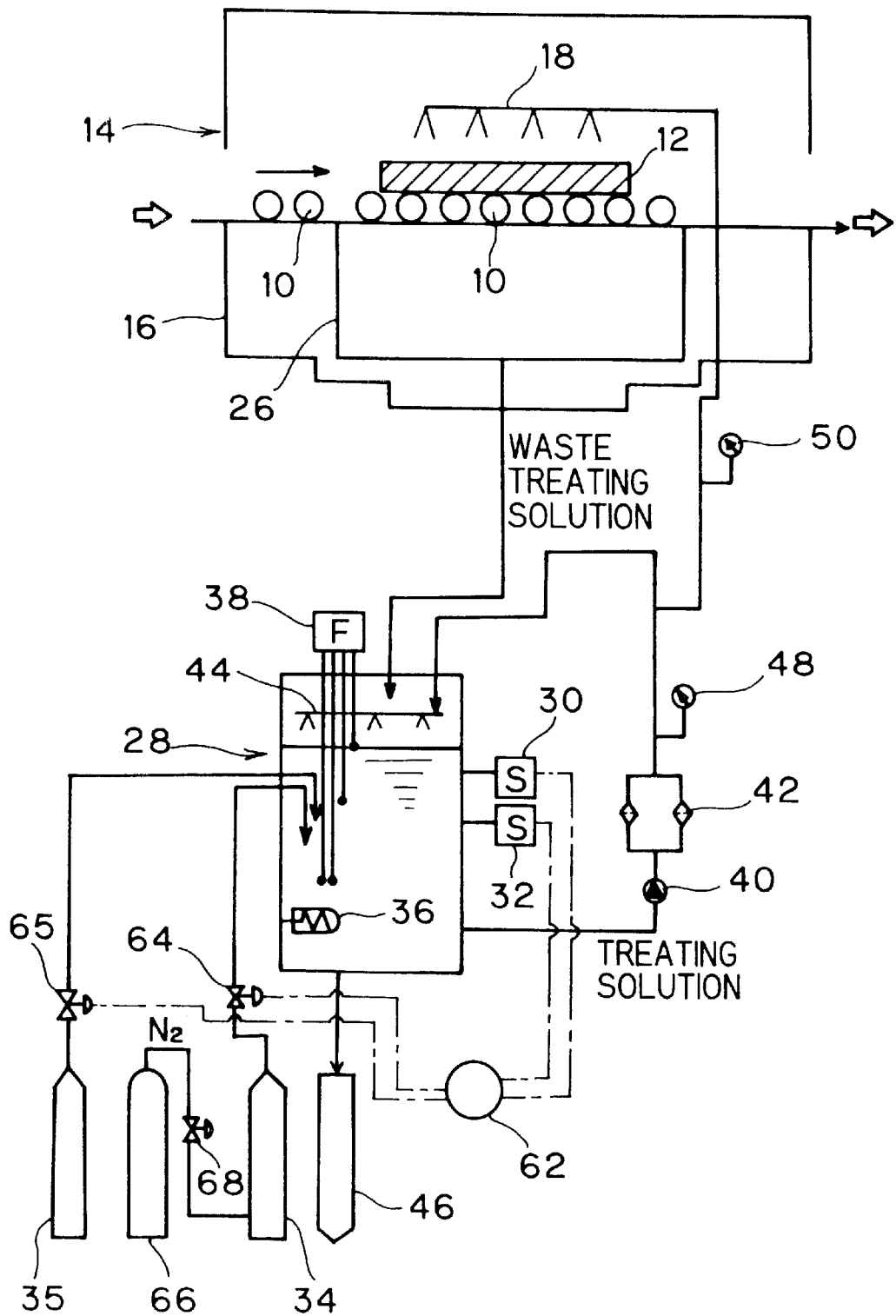
FIG. 2 is a systematic explanatory diagram showing details of concentration detection and solution supplement in the apparatus for treating surface of boards shown in FIG. 1.

A specific example of concentration detection and solution supplement in the waste solution collecting and supplementing device 28 is described by referring to FIG. 2. The electric conductivity and/or absorbance of the waste treating solution stored in the waste solution collecting and supplementing device 28 is measured by the electric conductivity meter 30 and/or the absorption photometer 32, and the measured value is put into the controller 62, and the concentration of one or more ingredients in the waste treating solution is detected. Depending on the detected concentration, the control valve 64 and/or control valve 65 is adjusted of the opening degree by a signal from the controller 62, treating solution for adjusting containing necessary ingredient to cover up to the loss is supplemented into the waste treating solution from the treating solution adjusting tank 34 and/or treating solution adjusting tank 35, and the treating solution is adjusted. In this case, the necessary ingredient from the treating solution adjusting tank 34 is fed under pressure by pressurized nitrogen gas, for example, from a nitrogen gas tank 66, and is supplemented into the waste treating solution. Reference numeral 68 is a control valve. The treating solution adjusting tank 35, not shown in detail, is similar to the treating solution adjusting tank 34.

A specific example of detecting method and adjusting method of concentration of ingredients in the waste treating solution is described below.

In an alkaline developing solution, the relation between the alkali concentration and electric conductivity is studied by experiments, and it has been confirmed that the alkali concentration is dominant over the electric conductivity, and hence can be measured with an advanced linear correlation, and decrease of the alkali concentration is detected by the electric conductivity meter, and it is adjusted by supplement of stock solution of alkaline developing solution having a higher alkali concentration than the treating solution.

Similarly, the relation between the resist concentration and absorbance is studied by experiments, and it has been confirmed that the resist concentration is dominant over the absorbance at the wavelength of visible region (for example, 480 nm), and hence can be measured with a linear correlation, and increase of resist concentration is detected by the absorption photometer, and it is adjusted by supplement of a fresh solution of alkaline developing solution not containing resist.

In an etching solution for transparent conductive film, the relation between the hydrobromic acid concentration and electric conductivity is studied by experiments, and it has been confirmed that the hydrobromic acid concentration is dominant over the electric conductivity, and hence can be measured with a linear correlation, and decrease of the hydrobromic acid concentration is detected by the electric conductivity meter, and it is adjusted by supplement of stock solution of etching solution having a higher hydrobromic acid concentration than the treating solution.

Similarly, the relation between the dissolved indium concentration and absorbance is studied by experiments, and it has been confirmed that the dissolved indium concentration is dominant over the absorbance at the wavelength of ultraviolet region or visible region (for example, 342 nm), and hence can be measured with a linear correlation, and increase of dissolved indium concentration is detected by the absorption photometer, and it is adjusted by supplement of a fresh etching solution not containing indium.

In a resist stripping solution containing alkanolamine and organic solvent, the relation between the monoethanolamine concentration and absorbance is studied by experiments, and it has been confirmed that the monoethanolamine concentration is dominant over the absorbance at the wavelength of near infrared region (for example, 1048 nm), and hence can be measured with an advanced linear correlation, and decrease of monoethanolamine concentration is detected by the absorption photometer, and it is adjusted by supplement of a stock solution of resist stripping solution having a higher monoethanolamine concentration than the treating solution.

Similarly, the relation between the resist concentration and absorbance is studied by experiments, and it has been confirmed that the resist concentration is dominant over the absorbance at the wavelength of visible region (for example, 550 nm), and hence can be measured with a linear correlation, and increase of resist concentration is detected by the absorption photometer, and it is adjusted by supplement of a fresh solution of resist stripping solution not containing resist.

In a resist stripping solution containing alkanolamine, organic solvent, and pure water, the relation between the water concentration and absorbance is studied by experiments, and it has been confirmed that the water concentration is dominant over the absorbance at the wavelength of near infrared region (for example, 976 nm), and hence can be measured with an advanced linear correlation, and decrease of water concentration is detected by the absorption photometer, and it is adjusted by supplement of pure water.

Similarly, the relation between the resist concentration and absorbance is studied by experiments, and it has been confirmed that the resist concentration is dominant over the absorbance at the wavelength of visible region (for example, 550 nm), and hence can be measured with a linear correlation, and increase of resist concentration is detected by the absorption photometer, and it is adjusted by supplement of a fresh solution of resist stripping solution not containing resist.

In a resist stripping solution containing alkanolamine, organic solvent, pure water, and hydroxylamine, the relation between the water concentration and absorbance is studied by experiments, and it has been confirmed that the water concentration is dominant over the absorbance at the wavelength of near infrared region (for example, 976 nm), and hence can be measured with an advanced linear correlation, and decrease of water concentration is detected by the absorption photometer, and it is adjusted by supplement of pure water.

Similarly, the relation between the hydroxylamine concentration and absorbance is studied by experiments, and it has been confirmed that the hydroxylamine concentration is dominant over the absorbance at the wavelength of near infrared region (for example, 1074 nm), and hence can be measured with an advanced linear correlation, and decrease of hydroxylamine concentration is detected by the absorption photometer, and it is adjusted by supplement of hydroxylamine solution.

Moreover, the relation between the resist concentration and absorbance is studied by experiments, and it has been confirmed that the resist concentration is dominant over the absorbance at the wavelength of visible region (for example, 550 nm), and hence can be measured with a linear correlation, and increase of resist concentration is detected by the absorption photometer, and it is adjusted by supplement of a fresh solution of resist stripping solution not containing resist.

Meanwhile, simultaneous and precise control for keeping constant the concentration of principal ingredients in the waste treating solution and dissolved resist concentration (or dissolved indium concentration) is extremely important for maintaining a specific treating performance of the treating solution.

Figure 3:
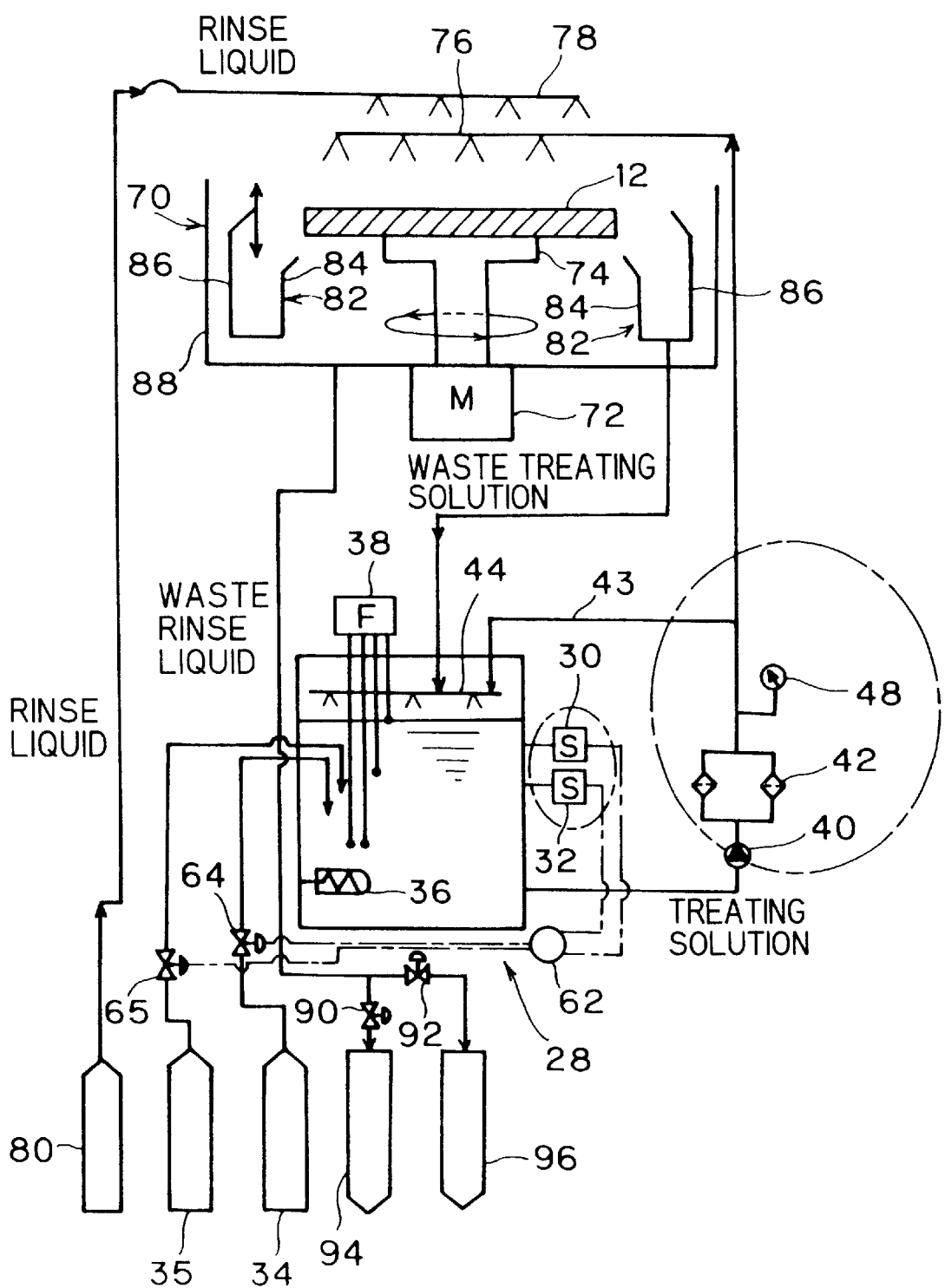
FIG. 3 is a systematic schematic structural diagram showing an apparatus for treating surface of boards in a second embodiment of the invention.

FIG. 3 shows an apparatus for treating surface of boards in a second embodiment of the invention. In this embodiment, a board is fixed on a rotatable wafer chuck, and a treating solution and a rinse liquid are sequentially supplied on the board surface, and the waste treating solution is collected separately from the waste rinse liquid by an elevatable cup having an outer wall and an inner wall.

As shown in FIG. 3, in a treating device (spinner) 70, a board 12 is fixed (placed) on a wafer chuck 74 rotatable by a drive motor 72, for example, known electrostatic means or attraction (sucking) means, and while the board 12 is being rotated, the treating solution is supplied from a spray nozzle 76 and applied on the board surface, and further the rinse liquid is supplied from a spray nozzle 78 on the board surface. Reference numeral 80 is a rinse liquid tank. Instead of the spray nozzles 76, 78, straight nozzle or other nozzle may be used. In this embodiment, the treating device (spinner) 70 is the treating means.

On the circumference of the wafer chuck 74, a chute (shoot) type cup (trough) 82 is provided to surround the fixed (placed) board 12, and this cup (trough) 82 is moved up and down in the vertical direction in the bottom of a housing 88 by means of an elevating device (not shown). More specifically, an inner wall 84 of the cup 82 moves vertically between the position for closing the circumference of the board 12 and the position for exposing the circumference of the board 12, while an outer wall 86 of the cup 82 is disposed at a position higher than the inner wall 84 and not lower than the height of the board 12 in descending position. That is, the upper part of the outer wall 86 of the cup 82 disposed so as to be always higher than the treating surface of the board 12 even when the cup (trough) 82 is at the lowest position. Reference numeral 88 is the housing surrounding the cup (trough) 82.

In FIG. 3, when the treating solution is supplied from the spray nozzle 76, the cup (trough) 82 is at the lowest position in the housing 88. The supplied treating solution is applied on the surface of the board 12 rotating together with the wafer chuck 74. The treating solution applied on the surface spreads uniformly outward by the rotation (centrifugal force) of the board 12. The waste treating solution spun off from the board 12 is discharged between the inner wall 84 and outer wall 86, that is, into the cup (trough) 82. On the other hand, when the rinse liquid is supplied from the spray nozzle 78, the cup (trough) 82 is at the highest position in the housing 88. The supplied rinse liquid is applied on the board 12 rotating together with the wafer chuck 74. The rinse liquid applied on the surface spreads uniformly outward by the rotation (centrifugal force) of the board 12. The waste rinse liquid spun off from the board 12 is discharged inside of the inner wall 84, that is, into the housing 88.

The waste treating solution in the cup (trough) 82 is sent into the waste solution collecting and supplementing device 28. The electric conductivity and/or absorbance of the waste treating solution stored in the waste solution collecting and supplementing device 28 is measured by the electric conductivity meter 30 and/or the absorption photometer 32, and the measured value is put into the controller 62, and the concentration of one or more ingredients in the waste treating solution is detected. Depending on the detected concentration, the control valve 64 and/or control valve 65 is adjusted of the opening degree by a signal from the controller 62, treating solution for adjusting containing necessary ingredient to cover up to the loss is supplemented into the waste treating solution from the treating solution adjusting tank 34 and/or treating solution adjusting tank 35, and the treating solution is adjusted. In the diagram, the construction including the electric conductivity meter 30 and/or the absorption photometer 32 enclosed by single dot chain line is the concentration detecting section.

The adjusted treating solution is sent into the filter 42 by the pump 40, and is filtered by the filter 42, and is supplied into the spray nozzle 76, and is recycled in the treating device (spinner) 70 for supplying to the board surface. In this case, as shown in FIG. 3, preferably, part of the treating solution filtered by the filter 42 is put back by treating solution return pipe 43 into the waste solution collecting and supplementing device 28, and to enhance the stirring effect when adjusting the treating solution, for example, it may be put back to the waste solution collecting and supplementing device 28 by using the spray nozzle 44. In the diagram, the construction including the pump 40, filter 42 and treating solution return pipe 43 enclosed by single dot chain line is the stirring and filtering section.

On the other hand, the waste rinse liquid in the housing 88 is discharged from the bottom of the housing 88, and collected separately from the waste treating solution. In this case, shortly after start of collection of waste rinse liquid (for example, in the first 15 seconds or so), waste treating solution or other foreign matter may be mixed in the waste rinse liquid, and a control valve 90 is opened and a control valve 92 is closed, and the waste rinse liquid is discharged into a first waste rinse liquid tank 94 in order to collect the waste rinse liquid containing foreign matter. In a certain time after start of collection of waste rinse liquid (for example, after 15 seconds or so), waste treating solution or other foreign matter may not be mixed in the waste rinse liquid, or if mixed, the amount is very slight, and, to the contrary, the control valve 92 is opened and the control valve 90 is closed, and the waste rinse liquid is discharged into a second waste rinse liquid tank 96. The waste rinse liquid collected in the second waste rinse liquid tank 96 can be directly recycle without any particular adjustment.

In this embodiment, meanwhile, the waste treating solution may be collected in the bottom of the housing 88, and the waste rinse liquid may be collected in the cup 82. In such a case, the waste solution collecting and supplementing device 28 is connected to the bottom of the housing 88.

The other construction and action are same as in the first embodiment.

Figure 4:
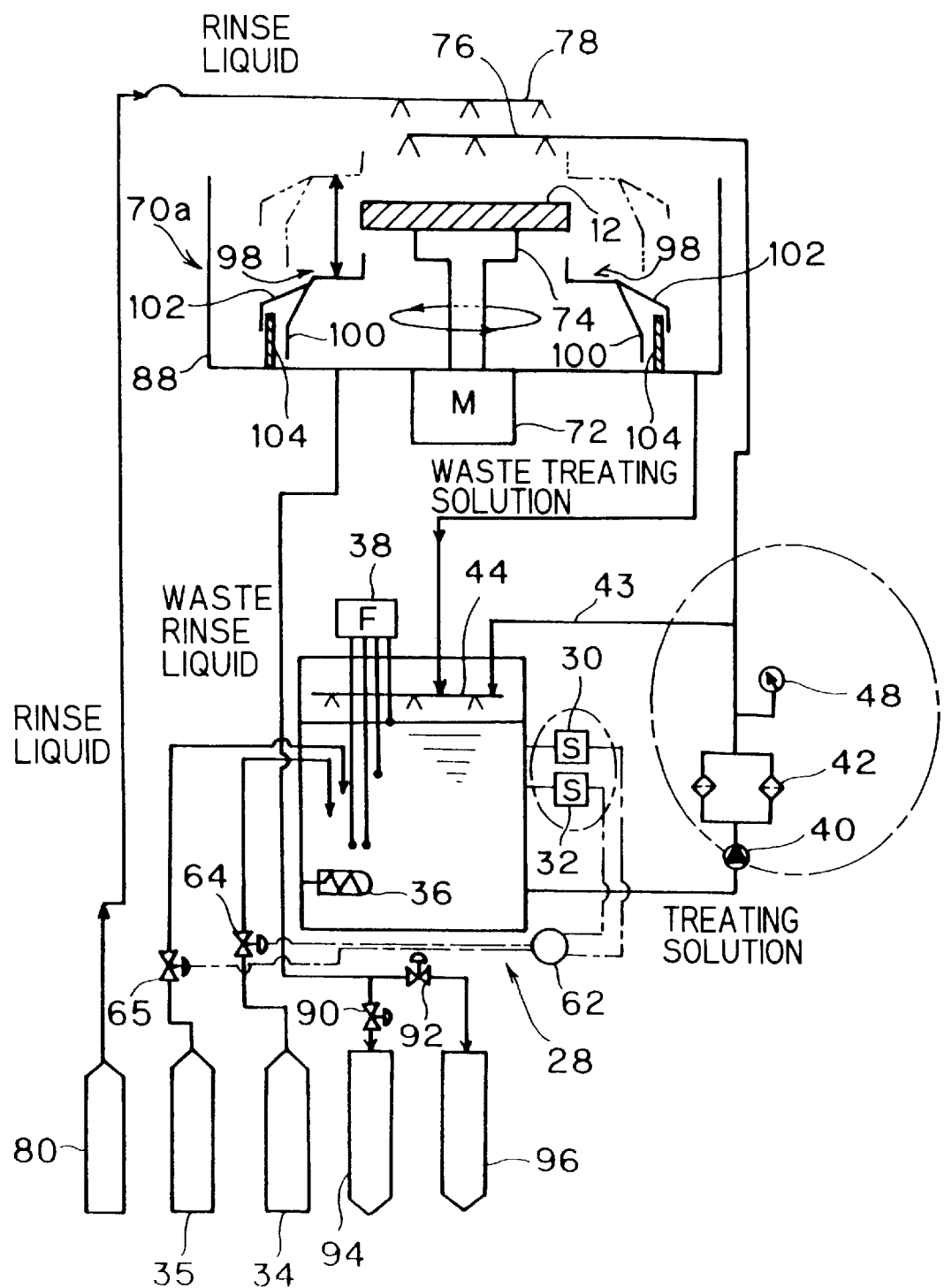
FIG. 4 is a systematic schematic structural diagram showing an apparatus for treating surface of boards in a third embodiment of the invention.

FIG. 4 shows an apparatus for treating surface of boards in a third embodiment of the invention. In this embodiment, a board is fixed on a rotatable wafer chuck, and a treating solution and a rinse liquid are sequentially supplied on the board surface, and the waste treating solution is collected separately from the waste rinse liquid by an elevatable inner cup having an inner skirt and an outer skirt, and a partition wall disposed in the bottom of the housing.

As shown in FIG. 4, in a treating device (spinner) 70a, a board 12 is fixed (placed) on a wafer chuck 74 rotatable by a drive motor 72, for example, known electrostatic means or attraction means, and while the board 12 is being rotated, the treating solution is supplied from a spray nozzle 76 and applied on the board surface, and further the rinse liquid is supplied from a spray nozzle 78 on the board surface. In the treating device 70a of the embodiment, too, instead of the spray nozzles 76, 78, straight nozzle or other nozzle may be used.

On the circumference of the wafer chuck 74, a skirt-shaped inner cup (guide) 98 is provided to surround the placed board 12, and this inner cup (guide) 98 is moved up and down in the vertical direction in the bottom of a housing 88 by means of an elevating device (not shown). The inner cup (guide) 98 is composed of an inner skirt 100 and an outer skirt 102, and a partition wall 104 disposed in the bottom of the housing 88 is disposed around so as to be positioned between beneath the inner skirt 100 and beneath the outer skirt 102. More specifically, when the inner cup (guide) 98 is positioned at the upper side of the board 12 (double dot chain line in the drawing), the inner skirt 100 guides the waste liquid (waste rinse liquid) from the board 12 to the inner side of the partition wall 104, and when the inner cup (guide) 98 is positioned at the lower side of the board 12 (solid line in the drawing), the outer skirt 102 guides the waste solution (waste treating solution) from the board 12 to the outer side of the partition wall 104.

In FIG. 4, when the treating solution is supplied from the spray nozzle 76, the inner cup (guide) 98 is at the lowest position in the housing 88. The supplied treating solution is applied on the surface of the board 12 rotating together with the wafer chuck 74. The treating solution applied on the surface spreads uniformly outward by the rotation (centrifugal force) of the board 12. The waste treating solution spun off from the board 12 is discharged at the outer side of the partition wall 104 by the upper surface (outer surface) of the outer skirt 102. On the other hand, when the rinse liquid is supplied from the spray nozzle 78, the inner cup (guide) 98 is at the highest position in the housing 88. The supplied rinse liquid is applied on the board 12 rotating together with the wafer chuck 74. The rinse liquid applied on the surface spreads uniformly outward by the rotation (centrifugal force) of the board 12. The waste rinse liquid spun off from the board 12 is discharged to the inner side of the partition wall 104 by the lower surface (inner surface) of the inner skirt 100.

The waste treating solution at the outer side of the partition wall 104 is removed from the bottom of the housing 88, is sent into the waste solution collecting and supplementing device 28. The electric conductivity and/or absorbance of the waste treating solution stored in the waste solution collecting and supplementing device 28 is measured by the electric conductivity meter 30 and/or the absorption photometer 32, and the measured value is put into the controller 62, and the concentration of one or more ingredients in the waste treating solution is detected. Depending on the detected concentration, the control valve 64 and/or control valve 65 is adjusted of the opening degree by a signal from the controller 62, treating solution for adjusting containing necessary ingredient to cover up to the loss is supplemented into the waste treating solution from the treating solution adjusting tank 34 and/or treating solution adjusting tank 35, and the treating solution is adjusted. In the diagram, the construction including the electric conductivity meter 30 and/or the absorption photometer 32 enclosed by single dot chain line is the concentration detecting section.

The adjusted treating solution is sent into the filter 42 by the pump 40, and is filtered by the filter 42, and is supplied into the spray nozzle 76, and is recycled in the treating device (spinner) 70a for supplying to the board surface. In this case, as shown in FIG. 4, preferably, part of the treating solution filtered by the filter 42 is put back by treating solution return pipe 43 into the waste solution collecting and supplementing device 28, and to enhance the stirring effect when adjusting the treating solution, for example, it may be put back to the waste solution collecting and supplementing device 28 by using the spray nozzle 44. In the diagram, the construction including the pump 40, filter 42 and treating solution return pipe 43 enclosed by single dot chain line is the stirring and filtering section.

On the other hand, the waste rinse liquid at the inner side of the partition wall 104 is discharged from the bottom of the housing 88, and collected separately from the waste treating solution. In this case, shortly after start of collection of waste rinse liquid (for example, in the first 15 seconds or so), waste treating solution or other foreign matter may be mixed in the waste rinse liquid, and a control valve 90 is opened and a control valve 92 is closed, and the waste rinse liquid is discharged into a first waste rinse liquid tank 94 in order to collect the waste rinse liquid containing foreign matter. In a certain time after start of collection of waste rinse liquid (for example, after 15 seconds or so), waste treating solution or other foreign matter may not be mixed in the waste rinse liquid, or if mixed, the amount is very slight, and, to the contrary, the control valve 92 is opened and the control valve 90 is closed, and the waste rinse liquid is discharged into a second waste rinse liquid tank 96. The waste rinse liquid collected in the second waste rinse liquid tank 96 can be directly recycle without any particular adjustment.

In this embodiment, meanwhile, the waste treating solution may be collected at the inner side of the partition wall 104 in the bottom of the housing 88, and the waste rinse liquid may be collected at the outer side of the partition wall 104 in the bottom of the housing 88. In such a case, the waste solution collecting and supplementing device 28 is connected to the bottom of the housing 88 at the inner side of the partition wall 104.

The other construction and action are same as in the first embodiment.

Figure 5:
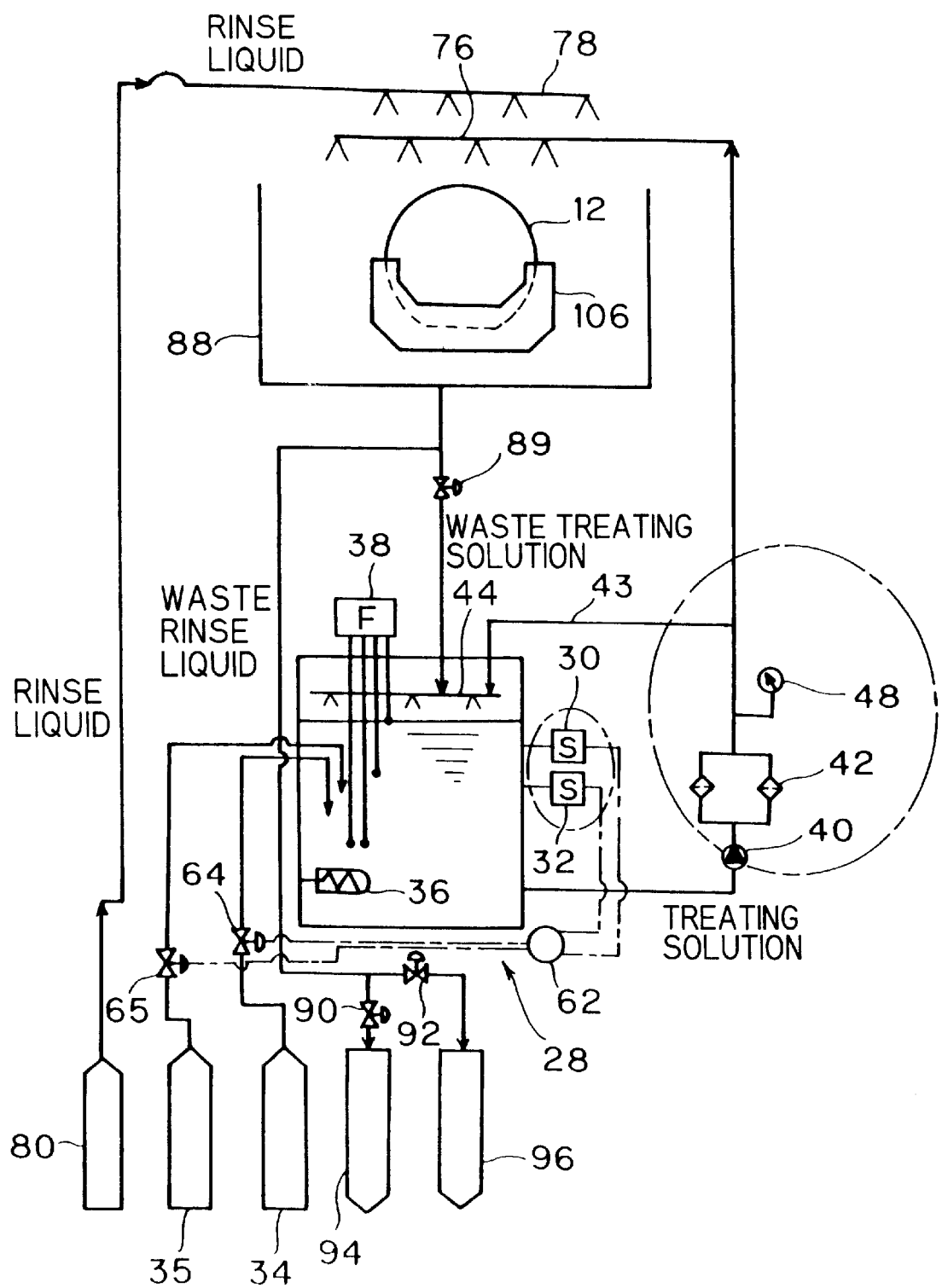
FIG. 5 is a systematic schematic structural diagram showing an apparatus for treating surface of boards in a fourth embodiment of the invention.

FIG. 5 shows an apparatus for treating surface of boards in a fourth embodiment of the invention. This embodiment relates to a cassette treating system, in which a cassette 106 is loaded and unloaded by a loader, and boards (for example, 20 silicon wafers for manufacturing semiconductors) are arranged on the cassette 106.

As shown in FIG. 5, a treating solution is supplied from a spray nozzle 76 to the boards 12 delivered into the housing 88, and the treating solution is applied on the board surface, and then a rinse liquid is applied from a spray nozzle 78.

The waste treating solution is removed from the bottom of the housing 88, and, by opening a control valve 89 and closing control valves 90 and 92, is sent into the waste solution collecting and supplementing device 28. The electric conductivity and/or absorbance of the waste treating solution stored in the waste solution collecting and supplementing device 28 is measured by the electric conductivity meter 30 and/or the absorption photometer 32, and the measured value is put into the controller 62, and the concentration of one or more ingredients in the waste treating solution is detected. Depending on the detected concentration, the control valve 64 and/or control valve 65 is adjusted of the opening degree by a signal from the controller 62, treating solution for adjusting containing necessary ingredient to cover up to the loss is supplemented into the waste treating solution from the treating solution adjusting tank 34 and/or treating solution adjusting tank 35, and the treating solution is adjusted. In the diagram, the construction including the electric conductivity meter 30 and/or the absorption photometer 32 enclosed by single dot chain line is the concentration detecting section.

The adjusted treating solution is sent into the filter 42 by the pump 40, and is filtered by the filter 42, and is supplied into the spray nozzle 76, and is recycled in the housing 88 for supplying to the board surface. In this case, as shown in FIG. 5, preferably, part of the treating solution filtered by the filter 42 is put back by treating solution return pipe 43 into the waste solution collecting and supplementing device 28, and to enhance the stirring effect when adjusting the treating solution, for example, it may be put back to the waste solution collecting and supplementing device 28 by using the spray nozzle 44. In the diagram, the construction including the pump 40, filter 42 and treating solution return pipe 43 enclosed by single dot chain line is the stirring and filtering section.

On the other hand, the waste rinse liquid is discharged from the bottom of the housing 88, and collected separately from the waste treating solution by closing the control valve 89. In this case, shortly after start of collection of waste rinse liquid (for example, in the first 15 seconds or so), waste treating solution or other foreign matter may be mixed in the waste rinse liquid, and a control valve 90 is opened and a control valve 92 is closed, and the waste rinse liquid is discharged into a first waste rinse liquid tank 94 in order to collect the waste rinse liquid containing foreign matter. In a certain time after start of collection of waste rinse liquid (for example, after 15 seconds or so), waste treating solution or other foreign matter may not be mixed in the waste rinse liquid, or if mixed, the amount is very slight, and, to the contrary, the control valve 92 is opened and the control valve 90 is closed, and the waste rinse liquid is discharged into a second waste rinse liquid tank 96. The waste rinse liquid collected in the second waste rinse liquid tank 96 can be directly recycle without any particular adjustment.

The other construction and action are same as in the first embodiment.

Having thus constructed, the invention brings about the following effects.

(1) The treating solution can be recycled efficiently, and hence the apparatus for treating surface of boards capable of maintaining the specified performance of the treating solution while recycling repeatedly can be obtained.

(2) Since the waste solution of treating solution (waste treating solution) can be collected separately from the waste liquid of rinse liquid (waste rinse liquid), and the treating performance of the treating solution can be maintained by supplement of necessary ingredients to the collected waste treating solution, the required quantity of the treating solution in a series of processes of treatment of surface of boards can be saved, and the treating solution can be recycled effectively. As a result, the disposal amount of water treating solution is decreased.

(3) It is not necessary to install individual spinners for treating solution and rinse liquid, and the apparatus for treating surface of boards is reduced in size. Besides, the rinse liquid can be applied immediately after treatment by treating solution.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An apparatus for treating the surface of boards, comprising:

treating means including a treating table, for treating the surface of boards by supplying sequentially a treating solution and a rinse liquid on boards placed on said treating table;

solution collecting means for collecting waste treating solution separately from waste rinse liquid;

waste solution storing means for storing said waste treating solution;

concentrating detecting and solution supplementing means for detecting the concentration of at least one ingredient in said waste treating solution by an electric conductivity meter and/or an absorption photometer, supplementing said waste treating solution by adjusting the necessary ingredients depending on the detected value; and treating solution feed means for feeding the adjusted treating solution into said treating means.

2. The apparatus for treating the surface of boards of claim 1, wherein said waste treating solution storing means has a stirring and filtering unit for stirring and filtering the waste treating solution.

3. The apparatus for treating the surface of boards of claim 1 further comprising:

waste rinse liquid separating means for collecting the waste rinse liquid, and separating it into waste rinse liquid containing foreign matter light after starting collection and second waste rinse liquid at a specific time after start of collection, depending on the time lapse after start of collection of said waste rinse liquid, wherein said waste rinse liquid separating means is connected to said solution collecting means.

4. The apparatus for treating the surface of boards of claim 1, wherein said boards treated by said treating means is any one of: a printed circuit board, a liquid crystal board, a semiconductor board, and a plasma display board.

5. The apparatus for treating the surface of boards of claim 1, wherein said treating table in said treating means is any one of: a rotatable wafer chuck, a roller conveyor, and a cassette.

6. The apparatus for treating the surface of boards of claim 5, wherein said treating table in said treating means is a rotatable wafer chuck on which the board is mounted, and wherein said solution collecting means includes an inner wall elevatable between a position for closing the circumference of the board and a position for exposing the circumference of the board, an outer wall for forming an elevatable cup by integrally connecting to the outer circumference of the inner wall, and a housing for enclosing the elevatable cup formed by the inner wall and outer wall.

7. The apparatus for treating the surface of boards of claim 5, wherein said treating table in said treating means is a rotatable wafer chuck on which the board is mounted, and wherein said solution collecting means includes an elevatable inner cup having an inner skirt and an outer skirt disposed to enclose the board, a housing for enclosing the inner cup, and a partition wall fixed on the bottom of the housing at a position between beneath the inner skirt and beneath the outer skirt, whereby the waste solution from the board is guided into the inner side of the partition wall from the inner skirt when the inner cup is positioned at the upper side of the board, and the waste solution from the board is guided into the outer side of the partition wall when the inner cup is positioned at the lower side of the boards.

8. The apparatus for treating the surface of boards of claim 1, wherein the treating solution supplied by said treating means is a developing solution.

9. The apparatus for treating surface of boards of claim 8, wherein the developing solution supplied by said treating means is a solution containing alkaline matter and 0.04 parts by weight to 25 parts by weight of pure water in 100 parts by weight of said alkaline matter.

10. The apparatus for treating the surface of boards of claim 8, wherein the ingredient detected by the electric conductivity meter and/or the absorption photometer is at least one of: alkaline substance, and dissolved resist in the developing solution.

11. The apparatus for treating the surface of boards of claim 8, wherein the alkaline substance contained in the developing solution is at least one selected from the group consisting of: potassium hydroxide, sodium hydroxide, sodium carbonate, sodium hydrogencarbonate, sodium phosphate, sodium silicate, tetramethyl ammonium hydroxide, and trimethyl monoethanol ammonium hydroxide.

12. The apparatus for treating the surface of boards of claim 1, wherein the treating solution supplied by said treating means is an etching solution for transparent conductive film.

13. The apparatus for treating the surface of boards of claim 12, wherein the etching solution for transparent conductive film supplied by said treating means is at least one of: a mixed aqueous solution of hydrochloric acid and nitric acid, a mixed aqueous solution of hydrochloric acid and ferric chloride, an aqueous solution of hydrobromic acid, a mixed aqueous solution of hydrobromic acid and ferric chloride, a mixed aqueous solution of hydroiodic acid and ferric chloride, and an aqueous solution of oxalic acid.

14. The apparatus for treating the surface of boards of claim 12, wherein the ingredient detected by the electric conductivity meter and/or the absorption photometer is at least one of: acid, and dissolved indium in the etching solution for transparent conductive film.

15. The apparatus for treating the surface of boards of claim 1, wherein the treating solution supplied by said treating means is a resist stripping solution.

16. The apparatus for treating the surface of boards of claim 15, wherein the resist stripping solution supplied by said treating means contains alkanolamine and 20 parts by weight to 800 parts by weight of organic solvent in 100 parts by weight of alkanolamine.

17. The apparatus for treating the surface of boards of claim 15, wherein the ingredient detected by the electric conductivity meter and/or the absorption photometer is at least one of: dissolved resist, and alkanolamine in the resist stripping solution.

18. The apparatus for treating the surface of boards of claim 15, wherein the resist stripping solution supplied by said treating means contains alkanolamine, 20 parts by weight to 800 parts by weight of organic solvent, and 5 parts by weight to 900 parts by weight of pure water in 100 parts by weight of alkanolamine.

19. The apparatus for treating the surface of boards of claim 15, wherein the ingredient detected by the electric conductivity meter and/or the absorption photometer is at least one of: dissolved resist, alkanolamine, and pure water in the resist stripping solution.

20. The apparatus for treating the surface of boards of claim 15, wherein the resist striping solution supplied by said treating means contains alkanolamine, 20 parts by weight to 800 parts by weight of organic solvent, 5 parts by weight to 900 parts by weight of pure water, and 1 parts by weight to 900 parts by weight of hydroxylamine in 100 parts by weight of alkanolamine.

21. The apparatus for treating the surface of boards of claim 15, wherein the ingredient detected by the electric conductivity meter and/or the absorption photometer is at least one of: dissolved resist, alkanolamine, pure water, and hydroxylamine in the resist stripping solution.

22. The apparatus for treating the surface of boards of claim 15, wherein the alkanolamine contained in the resist shipping solution is at least one amine selected from the group consisting of: monoethanolamine, diethanolamine, triethanolamine, N,N-dimethyl ethanolamine, N,N-diethyl ethanolamine, aminoethyl ethanolamine, N-methyl-N,N-diethanolamine, N,N-dibutyl ethanolamine, N-methyl ethanolamine, and 3-amino-1-propanol.

23. An apparatus for treating the surface of boards, comprising:
    treating means for treating the surface of boards by supplying sequentially a treating solution and a rinse liquid on boards placed on a treating table;
    solution collecting means for collecting waste treating solution separately from waste rinse liquid;
    waste solution storing, concentrating detecting and solution supplementing means for storing said waste treating solution, detecting the concentration of at least one ingredient in said waste treating solution by an electric conductivity meter and/or an absorption photometer, supplementing said waste treating solution by adjusting the necessary ingredients depending on the detected value; and
    treating solution feed means for feeding the adjusted treating solution into said treating means.

24. The apparatus for treating the surface of boards of claim 23 wherein said waste solution storing, concentrating detecting and solution supplementing means has a stirring and filtering unit for stirring and filtering the adjusting treating solution.

* * * * *

UNITED STATES PATENT AND TRADEMARK OFFICE
CERTIFICATE OF CORRECTION

PATENT NO.     : 6,302,600 B1
DATED          : October 16, 2001
INVENTOR(S)    : Hideo Nagase et al.

It is certified that error appears in the above-identified patent and that said Letters Patent is hereby corrected as shown below:

Column 14, claim 3,
Line 5, "light" should be -- right --.

Column 16, claim 20,
Line 2, "striping" should be -- stripping --.

Column 16, claim 22,
Line 3, "shipping" should be -- stripping --.

Column 16, claim 24,
Line 4, "adjusting" should be -- adjusted --.

Signed and Sealed this

Ninth Day of April, 2002

Attest:

Attesting Officer

JAMES E. ROGAN
Director of the United States Patent and Trademark Office